United States Patent [19]
Mallik et al.

[11] Patent Number: 6,016,852
[45] Date of Patent: *Jan. 25, 2000

[54] LEADED GRID ARRAY IC PACKAGE HAVING COPLANAR BENT LEADS FOR SURFACE MOUNT TECHNOLOGY

[75] Inventors: Debendra Mallik, Chandler; Rudra Kar, Mesa, both of Ariz.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/865,551

[22] Filed: May 29, 1997

Related U.S. Application Data

[63] Continuation of application No. 08/640,284, Apr. 24, 1996, abandoned, which is a continuation of application No. 08/348,750, Dec. 1, 1994, abandoned.

[51] Int. Cl.[7] .................................................. B21F 45/00
[52] U.S. Cl. ......................................... 140/71 R; 140/105
[58] Field of Search ........................... 174/52.1; 361/772, 361/773; 257/693, 695, 696, 697; 439/337, 66; 140/71 R, 105, 147

[56] References Cited

U.S. PATENT DOCUMENTS

| | | | |
|---|---|---|---|
| 3,147,779 | 9/1964 | Brown | 140/71 R |
| 3,757,271 | 9/1973 | Judge et al. | 339/17 CF |
| 4,530,002 | 7/1985 | Kanai | 257/697 |
| 4,546,543 | 10/1985 | Phaneuf | 140/105 |
| 4,591,951 | 5/1986 | Iwamoto et al. | 361/417 |
| 4,719,695 | 1/1988 | Sturner | 140/147 |
| 5,413,970 | 5/1995 | Russell | 437/208 |
| 5,467,803 | 11/1995 | Yoshimura et al. | 140/105 |
| 5,476,211 | 12/1995 | Khandros | 228/180.5 |
| 5,541,449 | 7/1996 | Crane, Jr. et al. | 257/697 |
| 5,548,161 | 8/1996 | Hirano et al. | 257/722 |

*Primary Examiner*—Lowell A. Larson
*Attorney, Agent, or Firm*—Blakely, Sokoloff, Taylor & Zafman LLP

[57] ABSTRACT

An integrated circuit package with a two dimensional array of leads that each have a foot portion which is bent at an angle relative to a vertical column portion of the leads. The foot portion of the leads are typically soldered to the surface pads of a printed circuit board. The leads are formed by a tooling apparatus which has a bending device that bends the foot portions of the leads onto a bending die. The tooling apparatus insures that the foot portions of the leads are all coplanar with the printed circuit board.

3 Claims, 4 Drawing Sheets

LEADED GRID ARRAY IC PACKAGE HAVING COPLANAR BENT LEADS FOR SURFACE MOUNT TECHNOLOGY

This is a Continuation Application of application Ser. No. 08/640,284, filed Apr. 24, 1996, now abandoned, which is a Continuation Application of application Ser. No. 08/348,750, filed Dec. 1, 1994, now abandoned.

BACKGROUND OF THE INVENTION

1. Field of the Invention

The present invention relates to an integrated circuit package.

2. Description of Related Art

Integrated circuits (ICs) are typically housed within a ceramic or plastic package that is mounted onto a printed circuit board (PCB). The packages have a plurality of leads that are soldered to surface pads on the printed circuit board, to electrically couple the ICs to the board. There are two common types of chip packages, quad flat packs (QFP) and pin grid arrays (PGA). Quad flat packs have leads extending from the sides of the package. The leads are typically gull winged (S shaped) and extend around the entire perimeter of the package. The gull wing shape provides flexibility in the leads, which compensates for thermal expansion between the package and the printed circuit board.

As IC's become larger, more leads are required for each package. Increasing the pin count on a quad flat pack requires either an increase in the size of the package, or a decrease in the spacing between the leads. Increasing the size of the package enlarges the footprint on the card and expands the overall size of the system. Because of manufacturing tolerances, the reduction of lead spacing typically requires the use of thinner leads. Leads of smaller diameter are subject to higher stresses and failure from vibration, fatigue or shock. Additionally, it is also more difficult to solder the smaller leads to the pads of the circuit board.

PGA packages typically have a two dimensional array of leads extending from the bottom of the package. Although PGA packages provide a high pin count, the leads are straight and rigid. Chip packages typically have a different coefficient of thermal expansion than the printed circuit board. When the assembly is subjected to temperature changes, the package expands at a different rate than the circuit board. This thermal expansion mismatch induces stresses in the leads, which can cause fatigue and failure at the solder joints. Additionally, the leads of a PGA package are mounted perpendicular to the circuit board. Such an assembly requires coplanarity between the board and the leads. If some leads are shorter than others, the short leads will not make contact with the board, leading to the formation of an inferior solder joint. It would be desirable to have an integrated circuit package which has leads that are all coplanar with the surface of a printed circuit board. It would also be desirable to have an efficient method for bending leads to be coplanar with a PCB.

SUMMARY OF THE INVENTION

The present invention is an integrated circuit package with a two dimensional array of leads that each have a foot portion which is bent at a right angle relative to a vertical column portion of the leads. The foot portion of the leads are typically soldered to the surface pads of a printed circuit board. The leads are formed by a tooling apparatus which has a bending device that bends the foot portions of the leads onto a bending die. The tooling apparatus insures that the foot portions of the leads are all coplanar with the printed circuit board.

It therefore is an object of the present invention to provide an integrated circuit module which has a two dimensional array of leads which are essentially coplanar with a printed circuit board.

It is also an object of the present invention to provide an inexpensive and efficient method of bending the leads of an integrated circuit module so that the leads are coplanar with a printed circuit board.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
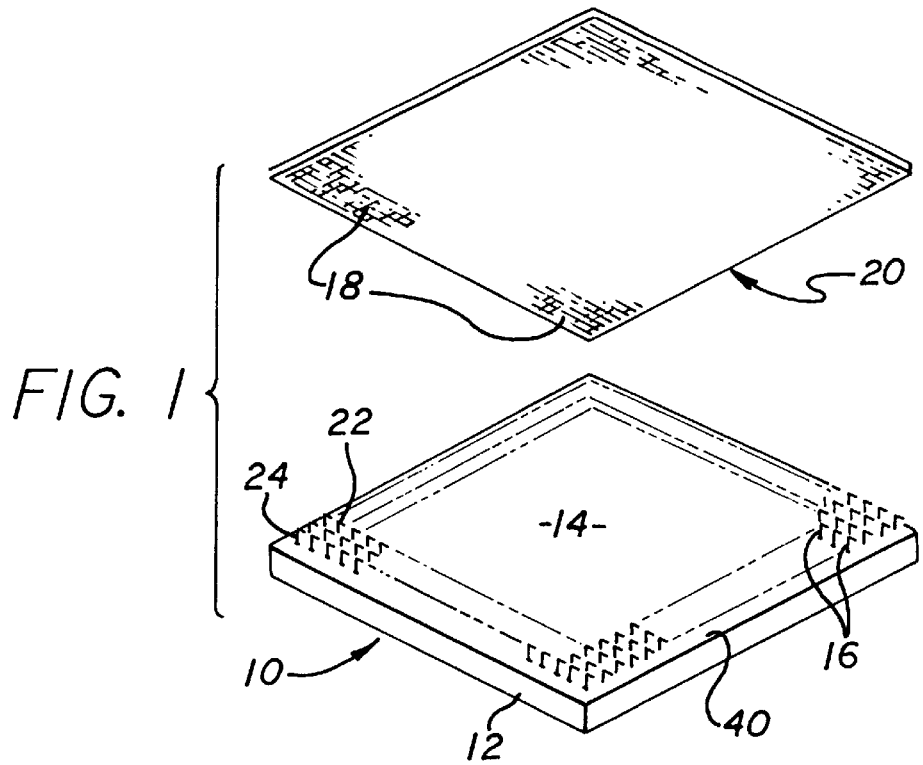
FIG. 1 is an exploded view of an integrated circuit module mounted to a printed circuit board.

Referring to the drawing more particularly by reference numbers, FIG. 1 shows an integrated circuit module 10 of the present invention. The module 10 typically contains an integrated circuit (not shown) that is encapsulated by a housing 12. The housing 12 may be constructed from plastic, ceramic or any other material commonly used to support electrical devices.

Extending from the bottom surface 14 of the housing 12 are a plurality of leads 16. The leads 16 are preferably arranged in a two dimensional array across the bottom of the housing 12 and are typically soldered to a matching array of surface pads 18 located on a printed circuit board 20. The leads 16 couple the integrated circuit to the printed circuit board 20.

The leads 16 each have a foot portion 22 which extends essentially perpendicular to a column portion 24. The foot portions 22 provide a large wetting surface for the solder used to attach the leads 16 to the pads 18. The large wetting surface increases the strength of the solder and the reliability of the overall assembly. The foot portions 22 are bent so that the bottom surface of the leads 16 are coplanar with the surface pads 18 of the printed circuit board 20. The coplanarity between the leads 16 and circuit board 20 insures that all of the leads 16 are in contact with the surface pads 18 when the module 10 is placed onto the board 20.

Figure 2:
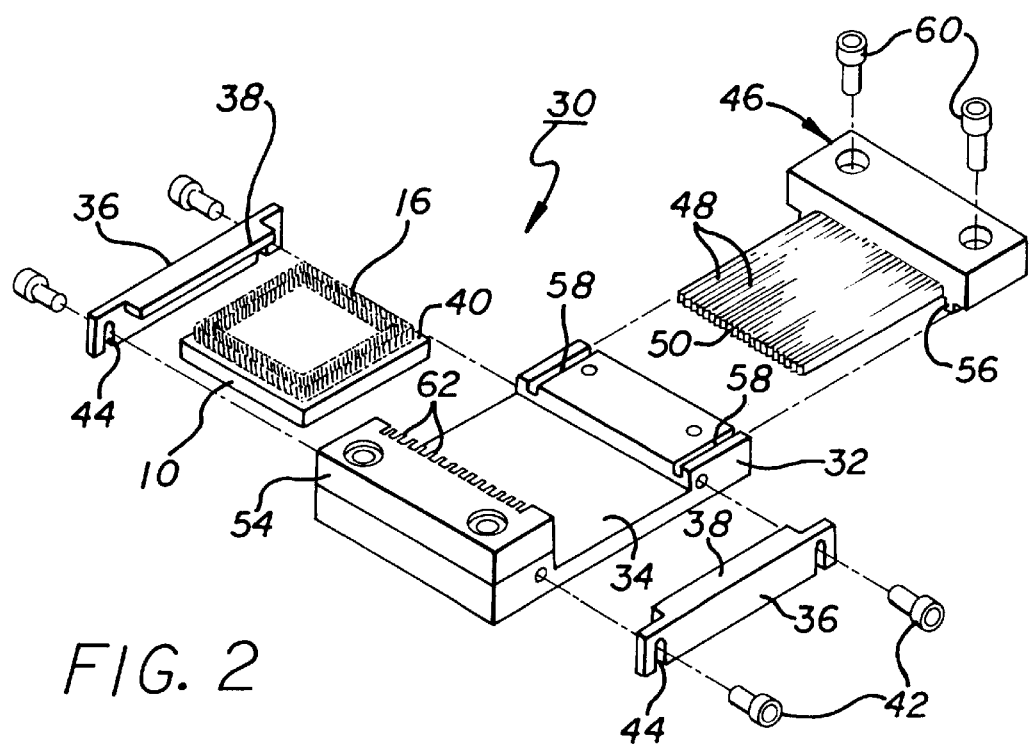
FIG. 2 is an exploded view of a tooling apparatus that can be used to bend the leads of an integrated circuit module.

FIG. 2 shows a tooling apparatus 30 which can be used to bend the leads 16 of the integrated circuit module 10. The tooling apparatus 30 includes a tooling plate 32 that has a groove 34 adapted to receive the module 10. The module 10 is held in place by a pair of end plates 36 which have upper flanges 38 that engage and capture the outer ridge portions 40 of the module 10. The end plates 36 are attached to the tooling plate by screws 42 which extend through slots 44 in the plates 36. The slots 44 allow the user to adjust the plates 36 to compensate for variances in the height of the module 10.

The tooling apparatus 30 also contains a bending die 46 which has a plurality of arms 48 that can be placed between the leads 16 of the module. The arms 48 have chamfered ends 50 which are received and captured by corresponding slots 52 in guide plate 54. The bending die 46 has a pair of dovetail shaped ridges 56 which can slide across corresponding channels 58 in the tooling plate 32. The ridges 56 and slots 58 guide the bending die 46 so that the arms 48 are located between the leads 16 of the module. The bending die 46 is held in place by a pair of screws 60.

Figure 3:
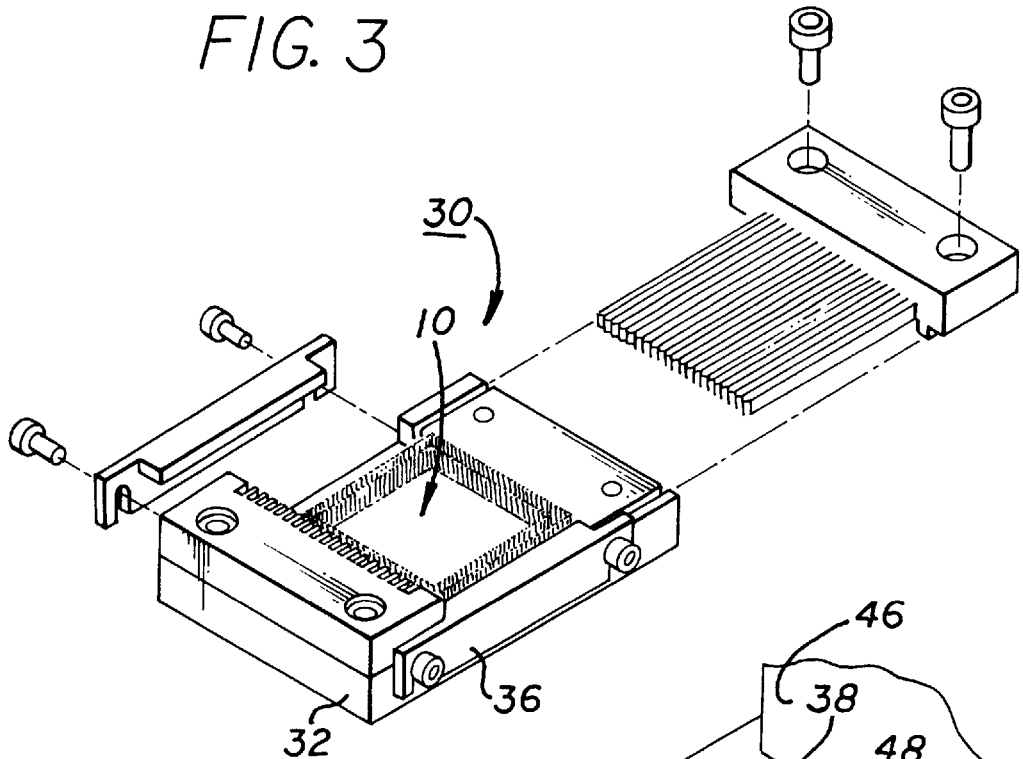
FIG. 3 is a perspective view of the integrated circuit module placed within a tooling plate of the tooling apparatus.
Figure 4A:
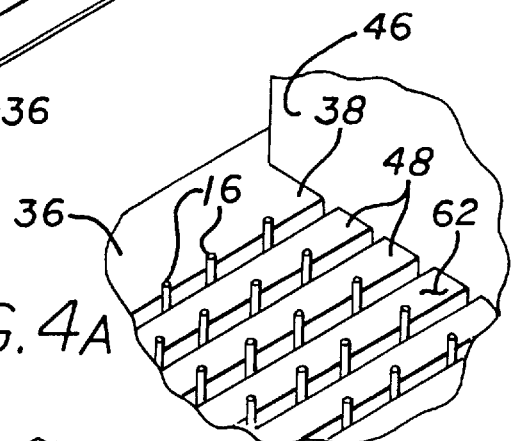
FIG. 4a is an enlarged view showing the leads of the module extending beyond a top surface of the bending die.
Figure 4:
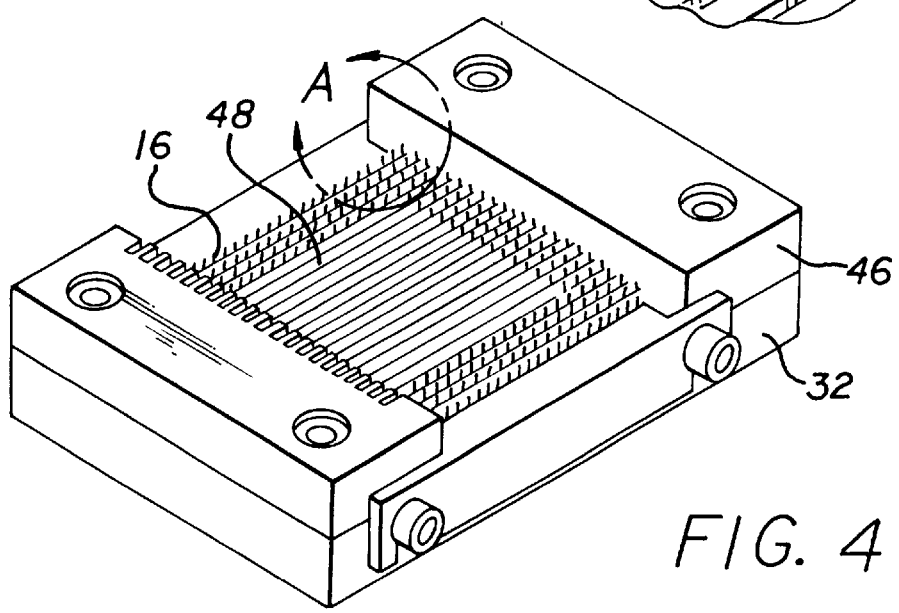
FIG. 4 is a perspective view of a bending die placed on top of the integrated circuit module.

As shown in FIG. 3, the module 10 is first placed into the slot 34 and the end plates 36 are attached to the tooling plate 32 to secure the module 10 to the fixture 32. As shown in FIG. 4, the bending die 46 is then coupled to the tooling plate 32 so that the arms 48 are located between the rows of leads 16. As shown in FIG. 4a, the height of the arms 48 is such that a predetermined portion of the leads 16 extends beyond a top surface 62 of the arms 48.

Figure 5:
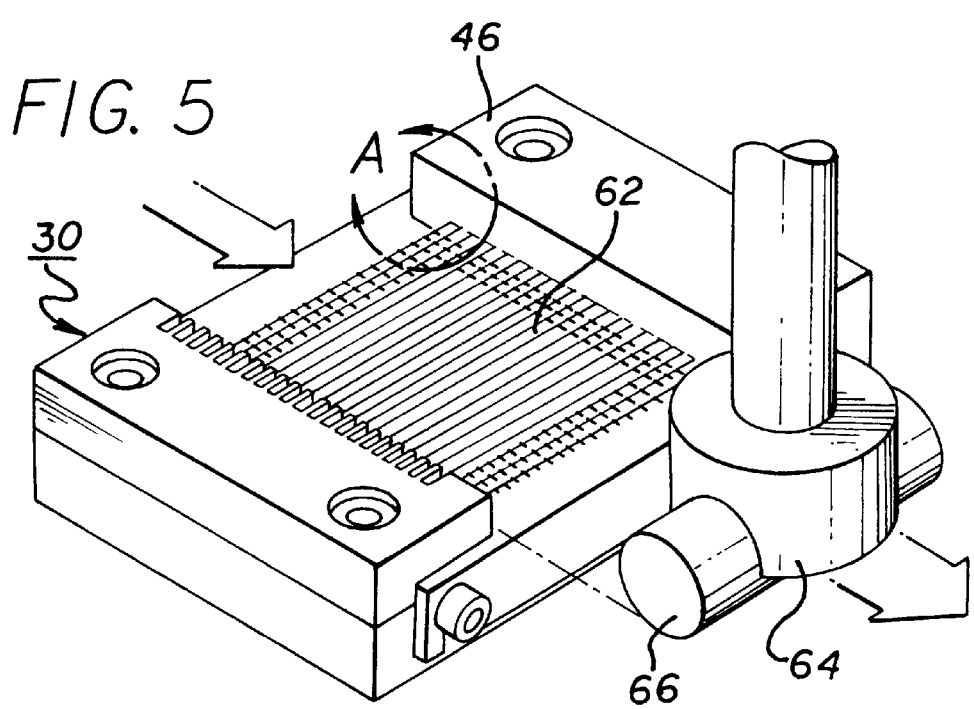
FIG. 5 is a perspective view of a rolling cylinder which bends the leads of the integrated circuit module.
Figure 5A:
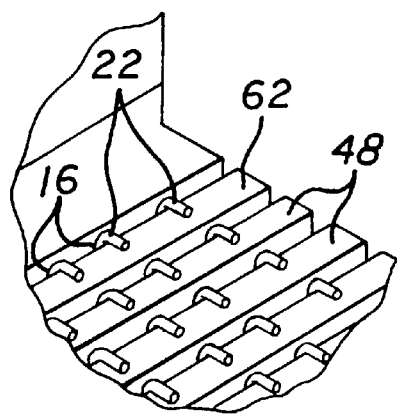
FIG. 5a is an enlarged view of the leads bent onto the support die.

As shown in FIG. 5, a bending device 64 is then moved over the bending die 46 to bend the exposed portions of the leads 16. In the preferred embodiment the bending device 64 is a cylinder 66 which is rolled over the top surface 62 of the bending die 46. As shown in FIG. 5a the movement of the cylinder 66 over the top surface of the die 46 bends the leads 16 onto the arms 48 to create the foot portions 22. The cylinder 66 is typically coupled to bearings (not shown) which allow the cylinder 66 to rotate relative to the leads 16. Rotation of the cylinder 66 reduces the amount of scratching on the surface of the leads 16, thereby improving the integrity of the solder joints between the module 10 and the circuit board 20. After the leads 16 are bent, the bending die 46 and end plates 36 are detached from the tooling plate 32, and the module 10 is removed for subsequent assembly to the board 20.

Figure 6:
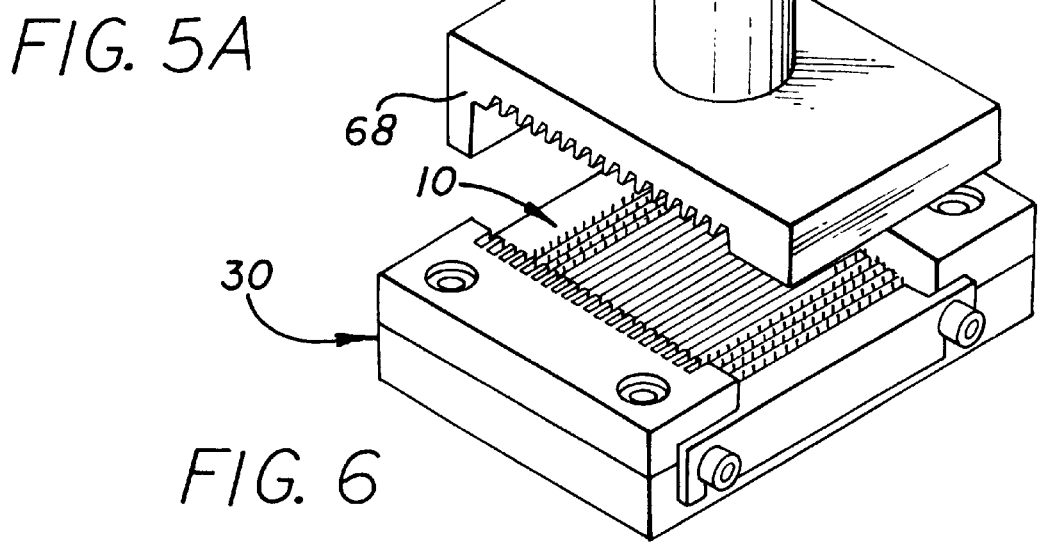
FIG. 6 is a perspective view of an alternate embodiment of the tooling apparatus showing a bending plate that bends the leads of the integrated circuit module.
Figure 6A:
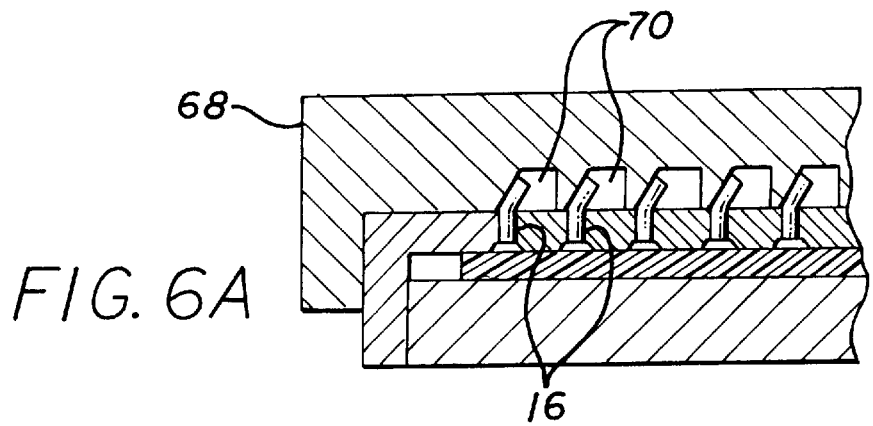
FIG. 6a is an enlarged side view showing the bending plate initially bend the leads of the integrated circuit module.
Figure 7:
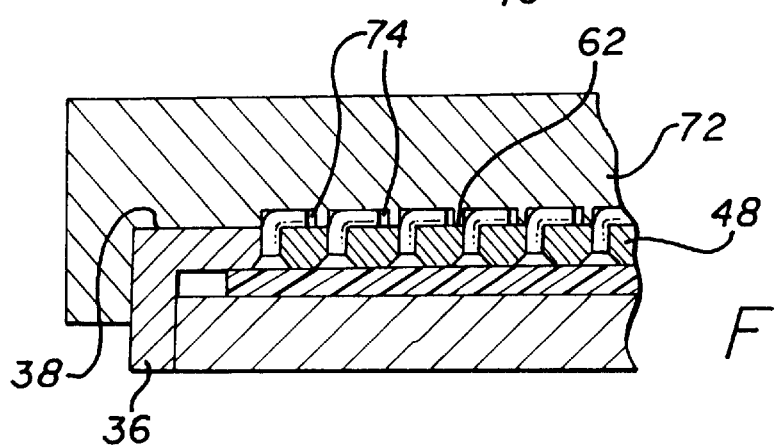
FIG. 7 is a view similar to FIG. 6a showing a second bending plate which bends the leads onto the bending die.
Figure 8:
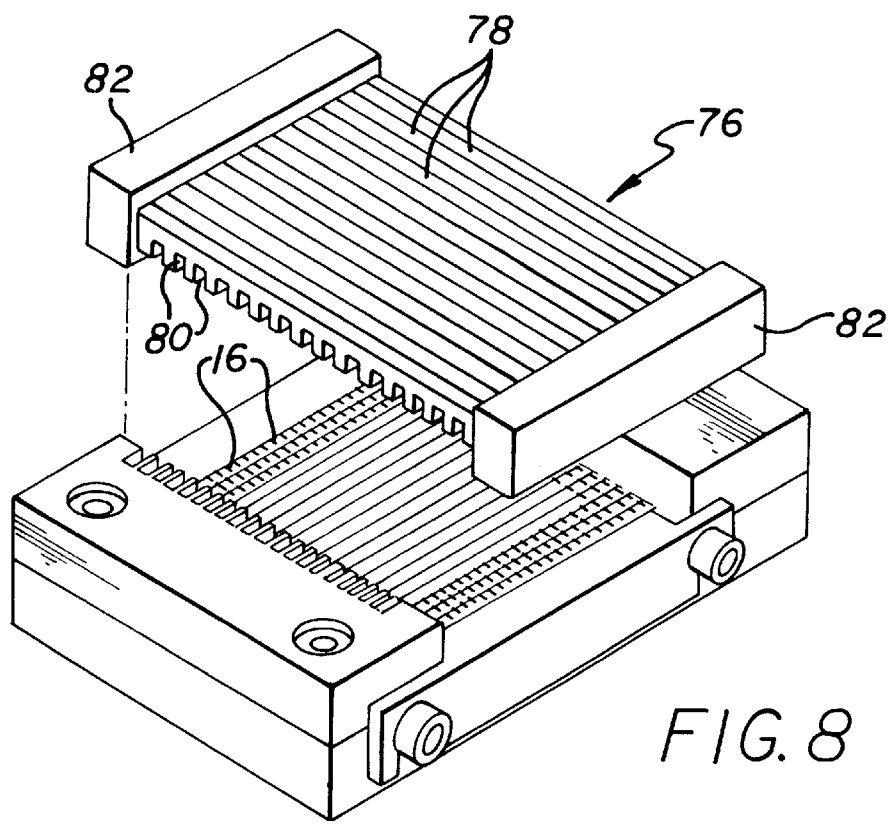
FIG. 8 is a perspective view showing a support die which can be placed on top of the integrated circuit module.

FIGS. 6, 6a and 8 show an alternate embodiment of the bending device 64. Instead of a rolling cylinder 66, a first bending plate 68 is pressed down onto the module 10. The first plate 68 has grooves 70 which have oblique surfaces that initially bend the exposed portions of the leads 16. The first plate 68 is then removed and a second plate 72 is pressed onto the module 10. As shown in FIG. 7, the second plate 72 contains grooves 74 that bend the exposed lead portions onto the top surface 62 of the arms 48. As an alternate embodiment, the top surface of the arms 48 may have a chamfer to alter the radius of the bend in the leads 16. A more radial bend will increase the spring effect of the leads 16.

FIG. 8 shows a support die 76 that can be placed onto the module after the leads 16 have been bent. The support die 76 has a plurality of arms 78 which extend between the leads 16 in a direction essentially perpendicular to the arms 48 of the bending die 46. The arms 78 of the support die 76 have a plurality of grooves 80 which provide clearance for the arms 48 of the bending die 46. The arms 78 are supported by a pair of guide bars 82 which align the grooves 80 with arms 48.

After the support die 76 is inserted, the bending die 46 is removed from the tooling plate 32. The arms 78 of the support die 76 prevent the foot portions 22 of the leads 16 from bending when the bending die 46 is removed. The support die 46 and end plates 36 are then detached and the module 10 is removed from the tooling plate 32.

The module 10 is typically mounted to a printed circuit board (not shown) which has a plurality of conductive surfaces arranged in a pattern that corresponds to the leads 16 of the module 10. A solder paste is typically applied to the surface pads through a template as is known in the art. The module 10 is then mounted to the circuit board so that the leads are in contact with the surface pads and the solder. The circuit board and module are then typically placed in a solder reflow machine, which reflows the solder and attaches the heads to the board.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A tooling apparatus for bending leads of an integrated circuit module, wherein the leads are arranged within at least one row across a bottom surface of the integrated circuit module, comprising:

a bending die which has an arm adapted to be placed adjacent to leads such that a foot portion of said leads extends beyond a top surface of said arm;

a plate which contains a groove that engages said foot portions of said leads; and, a support die which has a plurality of arms which can be placed between the leads essentially perpendicular to said arm of said bending die.

2. A method for bending leads of an integrated circuit package, comprising the steps of:

a) providing an integrated circuit package which has leads arranged in a row across a bottom surface of said integrated circuit package;

b) placing an arm of a bending die adjacent to said leads such that a foot portion of said leads extends beyond a top surface of said arm;

c) moving a bending device into operative contact with said leads such that said foot portions are bent toward said top surface of said arm; and, d) placing arms of a support die between said leads essentially perpendicular to said arm of said bending die after said leads are bent.

3. The method as recited in claim 2, further comprising the steps of removing said bending die from said leads and then removing said support die from said leads.

* * * * *